US010156026B2

(12) United States Patent
Smith

(10) Patent No.: US 10,156,026 B2
(45) Date of Patent: Dec. 18, 2018

(54) DIFFUSION ASSISTED CRYSTAL HYDROTHERMAL AND FLUX GROWTH

(71) Applicant: Daniel Smith, Northridge, CA (US)

(72) Inventor: Daniel Smith, Northridge, CA (US)

(73) Assignee: Silo Tech, Chatsworth, CA (US)

( * ) Notice: Subject to any disclaimer, the term of this patent is extended or adjusted under 35 U.S.C. 154(b) by 340 days.

(21) Appl. No.: 14/999,312

(22) Filed: Apr. 22, 2016

(65) Prior Publication Data

US 2017/0306525 A1 Oct. 26, 2017

(51) Int. Cl.

| | |
|---|---|
| ***C30B 30/06*** | (2006.01) |
| ***C30B 7/10*** | (2006.01) |
| ***C30B 9/00*** | (2006.01) |
| ***C30B 29/22*** | (2006.01) |
| ***C30B 29/18*** | (2006.01) |
| ***C30B 29/20*** | (2006.01) |

(52) U.S. Cl.

CPC ................ *C30B 30/06* (2013.01); *C30B 7/10* (2013.01); *C30B 9/00* (2013.01); *C30B 29/18* (2013.01); *C30B 29/20* (2013.01); *C30B 29/22* (2013.01)

(58) Field of Classification Search

CPC combination set(s) only.
See application file for complete search history.

(56) References Cited

U.S. PATENT DOCUMENTS 2,675,303 A * 4/1954 Hale ........................ C01B 33/12 117/224
3,101,259 A * 8/1963 Sawyer ..................... C30B 7/10 117/202
4,731,227 A * 3/1988 Pulvari ...................... B01J 3/08 310/369
2012/0179585 A1* 7/2012 Guzzo ................. G06Q 10/087 705/28

* cited by examiner

*Primary Examiner* — Duy Vu N Deo
*Assistant Examiner* — Erin F Bergner

(57) ABSTRACT

The purpose of diffusion assisted crystal hydrothermal growth is to facilitate a greatly increased crystal growth rate that would save time that is precious in such a material and manpower costly process. The assisted crystal growth itself requires the utilization of a piezoelectric shaker connected to the autoclave in which most industrial hydrothermal crystals are grown. The waveform can be modulated to induce transport of nutrient in a singular direction, customized to the topology of the apparatus. As it stands currently, the growth of most crystals that require autoclaves for their production can take anywhere from 3 months to up to 2 years, and accordingly carries many costs, particularly electricity and supervision of the autoclave(s), and other issues that may arise during the growth. While the product of this labor results in high-quality crystals, in reality, these are not at all what is needed outside of the laboratory environment. Using the assisted crystal hydrothermal growth process, average crystal growth can be cut in half, with the resulting crystals consequently being of a slightly lower quality, though still sufficient for most engineering purposes.

(Continued)

5
1
2
4
3

Another advantage of using a piezoelectric shaker is that an additional sensor can be added to the autoclave to monitor the health of the autoclave using trending data obtained during the growth.

6 Claims, 4 Drawing Sheets

DIFFUSION ASSISTED CRYSTAL HYDROTHERMAL AND FLUX GROWTH

CROSS-REFERENCE TO RELATED APPLICATION: NOT APPLICABLE

FEDERALLY SPONSORED RESEARCH

NOT APPLICABLE

SEQUENCE LISTING OR PROGRAM

NOT APPLICABLE

BACKGROUND

Field of Invention

This invention relates to single crystal growth in high pressure and high temperature autoclaves and in flux method production of piezoelectric crystals.

Prior Art

Industrial hydrothermal crystal growth and other methods for crystal growth are exceptionally time consuming and require the utilization of a great amount of resources, electricity and personnel, for proper operation. Generally, in laboratories and research and development teams, scientists have the tendency to prefer the most high-quality crystals possible. However, in industrial applications, a balance is required between performance, quality, and crystal growth time. In said industrial applications, the highest quality crystal possible is not necessarily required, therefore meaning that a new method of crystal growth is required to more perfectly strike this balance. It is possible to sacrifice some minor degree of quality to achieve a more economical growth time while still maintaining a working crystal. One existing way to increase the growth rate of hydrothermal crystals is to increase the temperature differential between the growth zone and the dissolving zone. However, this results in a product that is of lower quality than what can be produced via my invention. This invention is addressing another intrinsic property of the some of the crystals grown, in that their solubility is simply too low for standard hydrothermal conditions, like for example, crystals like Gallium Orthophosphate (GaPO4), Berlinite (AlPO4), Gallium Arsenate (GaAsO4) and other Quartz homeotypes. By shifting the nutrients to the seed with a sub-acoustic piezoelectric shaker, even with a nutrient that has low-solubility, the growth rate of the crystal is increased by a two to three-fold growth rate.

While it has been thought of to use a mechanical stirrer in the past, this method is both dangerous to use and cumbersome, making it impractical for use in high pressure and high temperature autoclaves. Furthermore, in the way that mechanical stirring is broadly applied, the action is in layman's terms "a back and forth action". The dissolved nutrients are shifted both towards the crystal seed and away from it, making overall progress limited. How this can instead be corrected in my invention is through the use of sub-acoustic piezoelectric shakers that produce waveforms that can produce pulses to solely push the nutrients towards the seed and prevent material from shifting back to its original position. These waveforms can correspondingly be changed to suit the specific growth needs of the crystal being grown.

It is also especially important to note the secondary application of the invention that would serve both a useful and important role with very little further change. This is, to monitor the 'health' of the autoclave during crystal growth. No such similar idea has been put into practice or discussed before, limiting any discussion on prior art. To monitor the 'health' of the autoclave, a sensor can be affixed to the appropriate location. During the operation of both the autoclave and shaker, the sensor will collect consistent trending data received from the inside of the autoclave. This data can thereupon be read and analyzed for any alarming abnormalities. The sudden rupture of a high-pressure autoclave can produce an explosion that is an incredibly dangerous event that can result in the loss of assets, personnel, and investment. That is why, if any method exists that can prevent such a catastrophe, even if just shortly ahead of time, it is very important information to both current and prospective users of autoclaves for crystal growth. Some examples of sensors that can be used to monitor the health of the autoclave include accelerometers and acoustic microphones.

A dynamic mechanical movement of the nutrient in the direction of the seeds requires physical displacement of the molecules that are transported. The lower the frequency of such mechanical forces, the larger the displacement obtained. Therefore, it is preferable to use low frequencies in the level of sub-acoustic to acoustic frequencies, instead of ultrasonics or higher frequencies in the megahertz range due to the fact that they could be destructive to the crystal structure during its growth. Some researchers utilize sonochemistry to achieve faster chemical reactions, though not necessarily for achieving crystal growth, but instead to achieve higher yields of a chemical reaction in a disorganized structure, very much in contrast to the organized nature of crystals.

SUMMARY

In accordance with one embodiment of my invention, a standard high-pressure, high-temperature autoclave used for crystal growth will have a piezoelectric shaker attached to enhance diffusional transport of nutrients to the growth zone. It is another improvement to the design to apply a sensor to the appropriate location to determine the health of the growth process and the apparatus. Also, it is also understandable that my method is applicable to high-temperature crystal growth via the flux method. In the same vein as the hydrothermal method, the flux method suffers from the same shortcoming of having an inefficient for industrial purposes process by which to shift nutrients to the crystal seed.

BRIEF DESCRIPTION OF THE DRAWINGS

The foregoing and other objects, features, and advantages of my invention will be apparent from the following more particular description of a preferred embodiment of the invention, as illustrated in the accompanying drawings. The drawings are not necessarily made to scale, but instead are used to detail the nature and principle of the invention. The preferred embodiment(s) of the present invention is/are described in conjunction with the associated drawings in which like features are indicated with like reference numerals and in which.

DESCRIPTION OF THE EMBODIMENTS

Figure 1:
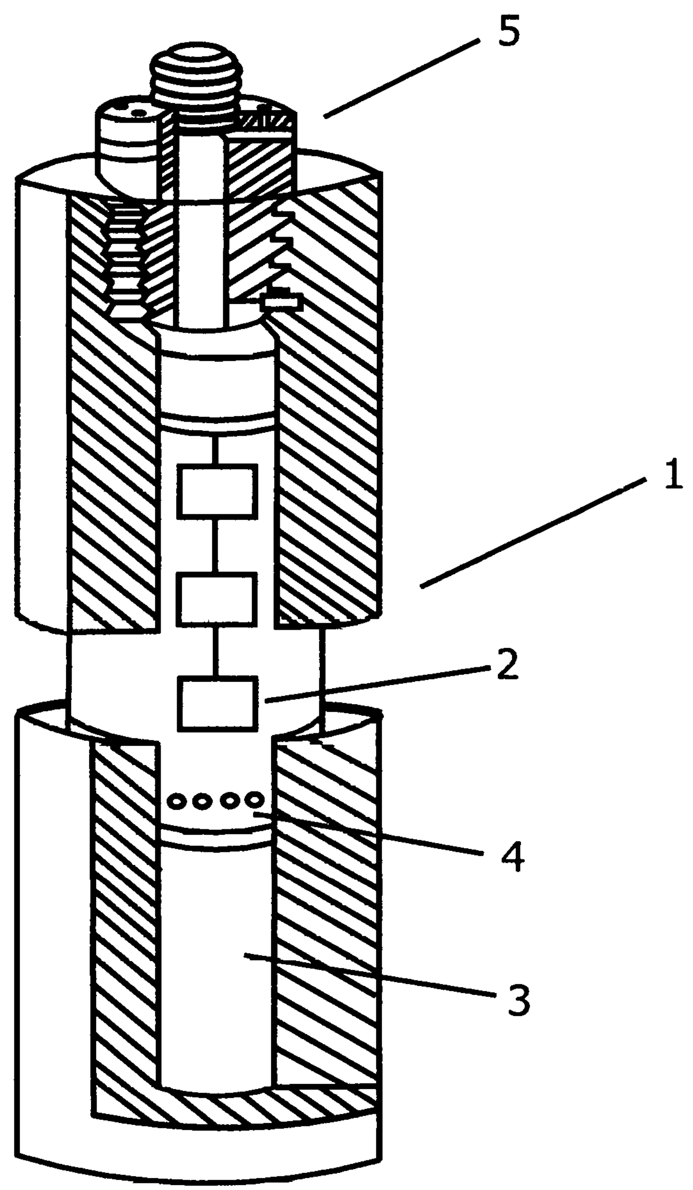
FIG. 1 is a frontal view of a high-pressure autoclave 1 for growing crystals like quartz in which typically the solubility increases with increased temperature, and thus the seeds 2 are kept at the top and the nutrient 3 is kept at the bottom, with a temperature gradient for circulation and separated by a baffle 4. The head 5 of the autoclave is exposed in the illustration.
Figure 2A:
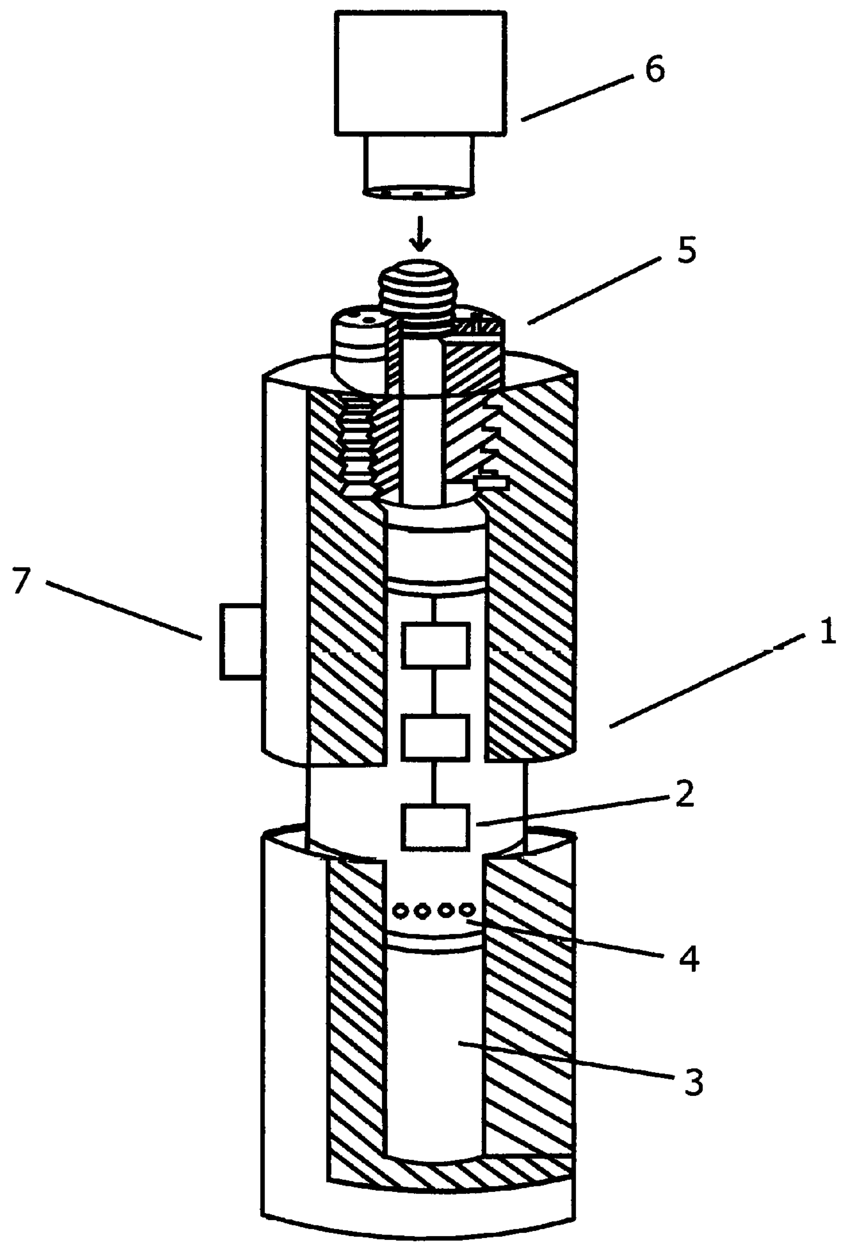
FIG. 2A is a frontal view of a high-pressure autoclave 1 for growing crystals like quartz in which typically the solubility increases with increased temperature, and thus the seeds 2 are kept at the top and the nutrient 3 is kept at the bottom, with a temperature gradient for circulation and separated by a baffle 4 with the additional piezoelectric shaker 6 attached on the head 5 of the autoclave. Attached onto the side of the autoclave is an additional sensor 7 for monitoring the health of the autoclave.

On one of the embodiments of my invention, a piezoelectric shaker 6 is located on the top of the autoclave 1 (FIG. 2A). The piezoelectric shaker 6 applies a waveform signal that translates to mechanical movement within the autoclave 1 during operation and increases the diffusion process of the nutrient 3 being transported to the crystal seeds 2, accordingly increasing crystal growth rate. This method for accelerating crystal growth as has been noted in previously, carries numerous advantages to conventional growth accelerants from being hypothetically safer to mechanical stirrers to being adaptable to different crystals via modifiable waveforms. In some cases, the piezoelectric shaker 6 will require isolation from the high-temperature autoclave 1, though this will depend on the growth conditions of the autoclave 1 and the shaker 6 used. Also note, that instead of piezoelectric shaker, other types of mechanical motion can be applied such as that by a electrodynamic shaker or a simple pendulum with a hammer. It should also be important to note that an additional sensor 7 can be fitted to the autoclave as well as the shaker to measure trending data and take other measurements from the autoclave to essentially measure the "health" of the autoclave and in some cases, measure the progress of growth in the autoclave. This sensor 7 can be an accelerometer, a strain gauge, or an ultrasonic sensor selected based upon the frequencies and amplitudes needed for growth. The monitoring of crystal growth via sensor 7 has never been done before in a scientific or industrial setting even though crystal growth is a perfect setting for such monitoring, due to the fact that during hydrothermal growth, there are no gases, solids, metals or liquids within the autoclave 1, only a mechanically ideal environment for transferring signals.

By utilizing, the apparatus as described above, a faster crystal growth rate can be achieved, to a level that the quality of the crystals is not compromised. As the industry stands today, the level of quality demanded results in growth periods for crystals that are entirely too long for proper industrial mass production and result in the atrocious wasting of valuable manpower, energy, and time. This embodiment can be used to grow just about any hydrothermal crystal from Quartz to Sapphire.

Figure 2B:
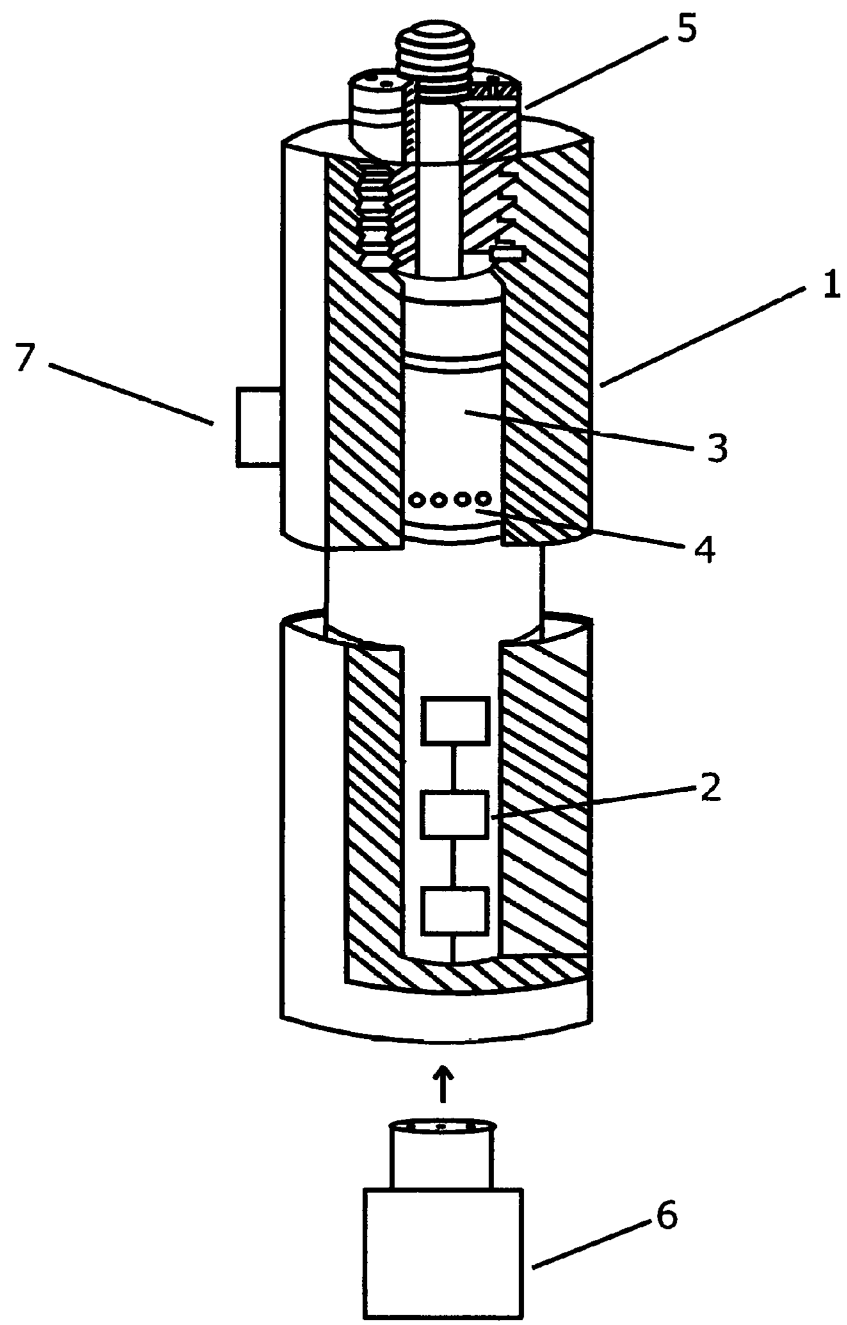
FIG. 2B is a frontal view of a high-pressure autoclave 1 for growing crystals like gallium orthophosphate or Berlinite in which typically the solubility decreased (retrograde) with increased temperature, and thus the seeds 2 are kept at the bottom and the nutrient 3 is kept at the top, with a temperature gradient for circulation with the additional piezo-shaker 6 attached on the bottom of the autoclave. Attached onto the side of the autoclave is an additional sensor 7 for monitoring the health of the autoclave.
Figure 3:
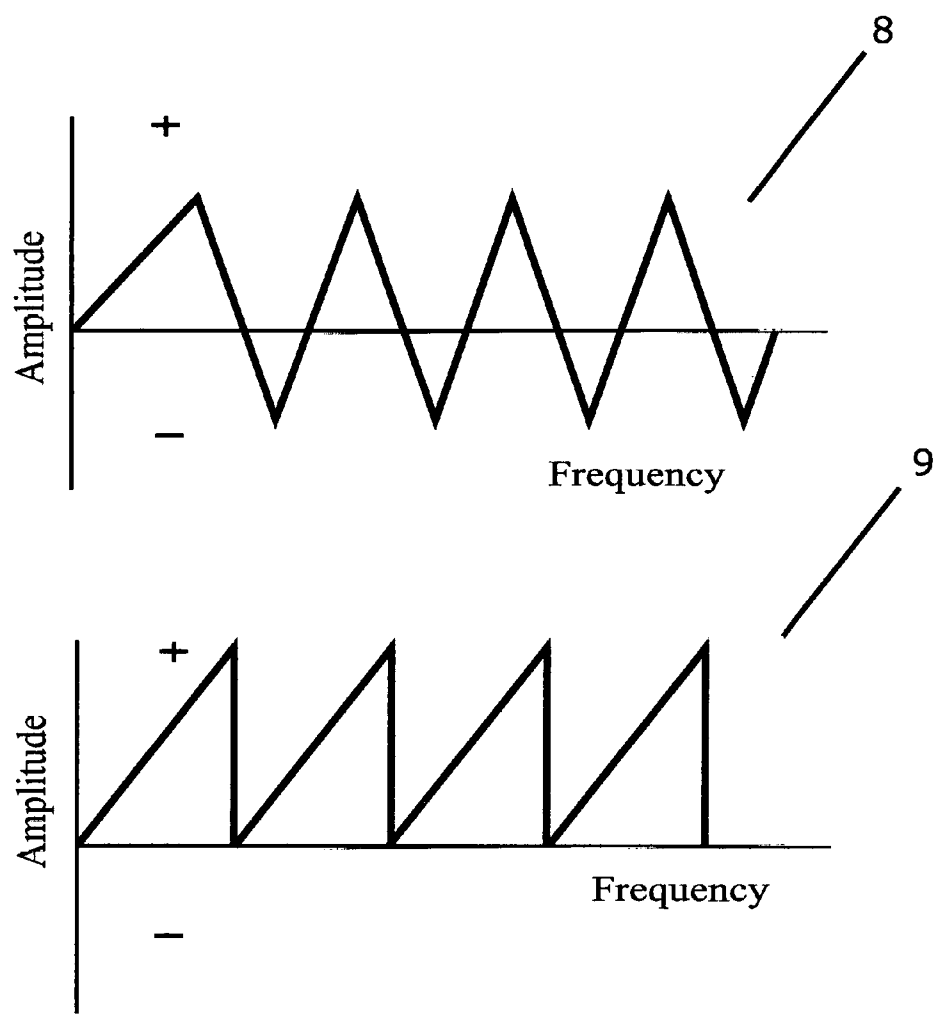
FIG. 3 is an example of two waveforms applied to the piezoelectric shaker 6, one to always produce movement in one direction, the half signal 9, and one that allows movement in both directions, the complete signal 8. The half signal waveform could be a ramp, half-sine, or pulse.

On another of the embodiments of my invention (FIG. 2B), the process is performed in almost exactly the same manner, except it is used on an inverted, retrograde autoclave 1 taking advantage of the fact that the piezoelectric shaker 6 can be placed on both the bottom and the top of the autoclave 1 with no loss of results. A characteristic of a piezoelectric shaker is that an electrical signal is converted into a mechanical signal, and by changing the polarity of the electrical signal, the resulting mechanical output can be changed as well. This embodiment can be used to grow crystals such as Gallium Orthophosphate, Berlinite, Gallium Arsenate, or any other Quartz homeotypes, that while currently may take up to a year to grow, can take as little as four months with my method.

Because many of the crystals grown by autoclave 1 are piezoelectric and the shaker 6 used is piezoelectric, the resulting phenomena could be that a combination of ideal conditions will result in the growing crystals aligning with the signal with synergy, similar to the phenomena of swinging pendulums aligning over time at a particular resonant frequency. The net effect is an improved crystal structure and rate of growth accelerated by my invention.

The same approach utilized onto an autoclave can be applied to the flux method, as the piezocicctric shaker might be attached to the crucible and produce the same effects of accelerating the diffusional transfer of nutrient to the seeds. The flux method can be used to grow also Gallium ortho Phosphate and other crystals grown by the melt, or in a flux.

The foregoing description of the preferred embodiment of the invention has been presented for the purposes of illustration and description. While this invention has been particularly shown and described with reference to preferred embodiments thereof, it will be understood by those skilled in the art that various changes in form and details may be made without departing from the spirit and scope of the invention in the following claims. It is not intended to be exhaustive or to limit the invention to the precise form disclosed. Many modifications and variations are possible in light of the above teachings. It is intended that the scope of the invention be limited not with this detailed description, but rather by the claims appended hereto.

I claim:

1. A method of accelerating crystal growth in a hydrothermal autoclave by mechanically improving diffusion in a process of transporting nutrient to seeds, comprising:

A piezoelectric shaker attached to the head of a high-pressure hydrothermal autoclave, applying a signal to said piezoelectric shaker, enough to produce mechanical movement inside the autoclave controlling the signal applied to said piezoelectric shaker, monitoring a signal coming from the piezoelectric shaker wherein at least one sensor, including an accelerometer or an acoustic microphone is attached to said hydrothermal autoclave.

2. The method as defined in claim 1, in which trending data is taken from the at least one sensor, related to the health of the autoclave.

3. The method as defined in claim 1, in which trending data is taken from the at least one sensor, related to the growth rate of the crystals.

4. The method as defined in claim 1, in which piezoelectric crystals including Gallium Orthophosphate, Berlinite, Gallium Arsenate, or Quartz homeotypes are grown.

5. The method as defined in claim 1, in which the flux method is utilized to grow piezoelectric crystals including Gallium Orthophosphate, Berlinite, Gallium Arsenate, or Quartz homeotypes.

6. The method as defined in claim 5, such that the quality of the piezoelectric crystals are optimized by fewer number of impurities found in the grown piezoelectric crystals by the lack of deterioration of the autoclave which is monitored during the growth by the use of the at least one sensor.

* * * * *